(12) United States Patent
Pan et al.

(10) Patent No.: US 7,544,572 B2
(45) Date of Patent: Jun. 9, 2009

(54) MULTI-OPERATIONAL MODE TRANSISTOR WITH MULTIPLE-CHANNEL DEVICE STRUCTURE

(75) Inventors: James Pan, Fishkill, NY (US); John Pellerin, Hopewell Junction, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 170 days.

(21) Appl. No.: 11/289,682

(22) Filed: Nov. 30, 2005

(65) Prior Publication Data

US 2007/0122983 A1    May 31, 2007

(51) Int. Cl.
H01L 21/336    (2006.01)
(52) U.S. Cl. ............... 438/283; 438/309; 438/166; 438/268; 257/E21.43
(58) Field of Classification Search ............... None
See application file for complete search history.

(56) References Cited

U.S. PATENT DOCUMENTS

| | | | |
|---|---|---|---|
| 4,908,678 A | | 3/1990 | Yamazaki |
| 5,243,206 A | * | 9/1993 | Zhu et al. ............ 257/192 |
| 5,412,224 A | * | 5/1995 | Goronkin et al. ........ 257/15 |
| 5,747,854 A | | 5/1998 | Gotou |
| 6,246,077 B1 | | 6/2001 | Kobayashi et al. |
| 2002/0125497 A1 | | 9/2002 | Fitzgerald |
| 2005/0112851 A1 | * | 5/2005 | Lee et al. ............ 438/497 |

FOREIGN PATENT DOCUMENTS

| | | |
|---|---|---|
| EP | 1450394 | 8/2004 |
| FR | 2856521 | 12/2004 |
| WO | WO 2005/004241 | 1/2005 |

OTHER PUBLICATIONS

PCT International Search Report for International Application No. PCT/US2006/044308 mailed Mar. 1, 2007.
International Preliminary Report on Patentability PCTUS2006/044308.

* cited by examiner

*Primary Examiner*—N Drew Richards
*Assistant Examiner*—Kyoung Lee
(74) *Attorney, Agent, or Firm*—McDermott Will & Emery, LLP

(57) ABSTRACT

A multiple operating mode transistor is provided in which multiple channels having different respective operational characteristics are employed. Multiple channels have threshold voltages that are independently adjustable. The independent adjustment of the threshold voltage includes providing at least one of different respective doping concentrations in the different channels, different respective gate dielectric thicknesses for the different gate dielectrics separating the channels, and different respective silicon channel thicknesses for the different channels.

26 Claims, 7 Drawing Sheets

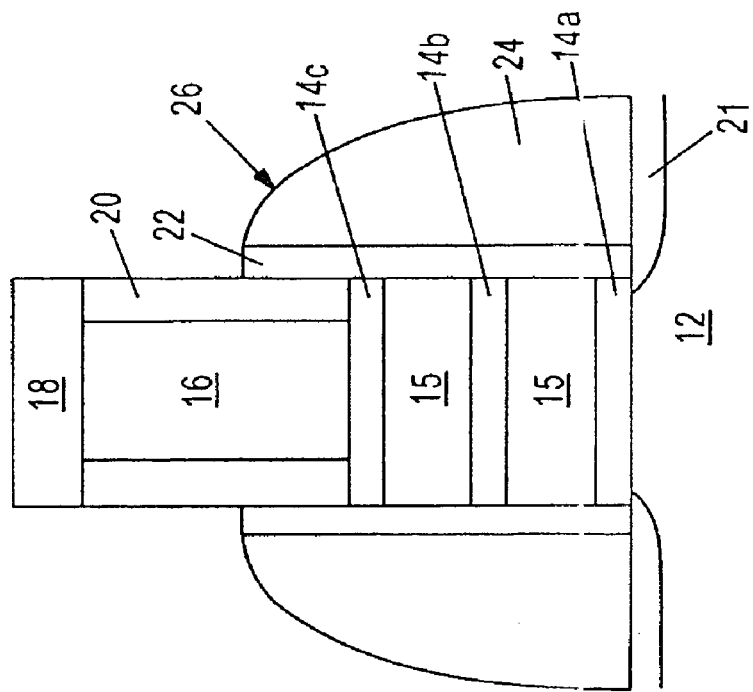
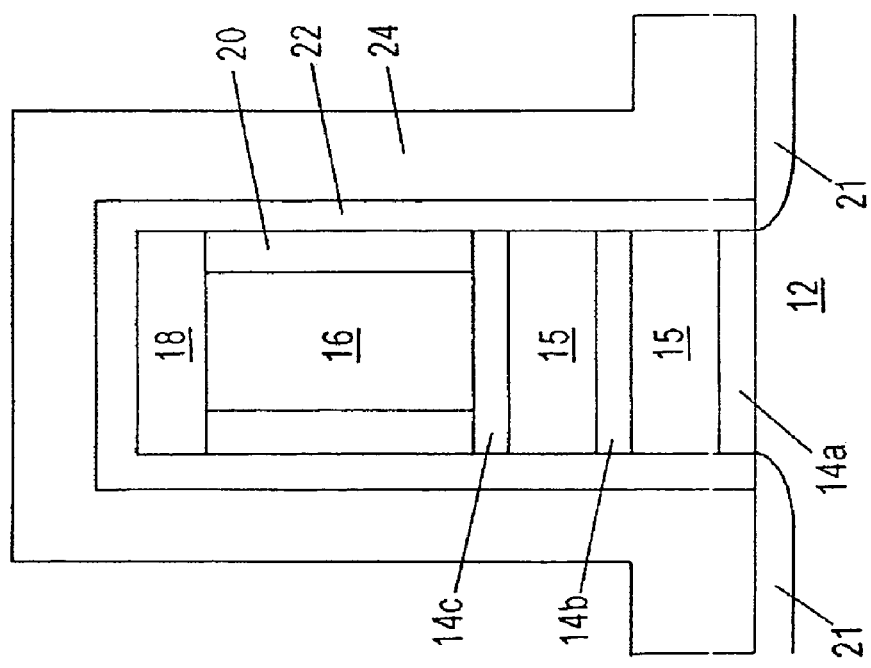
Fig. 4
Fig. 3

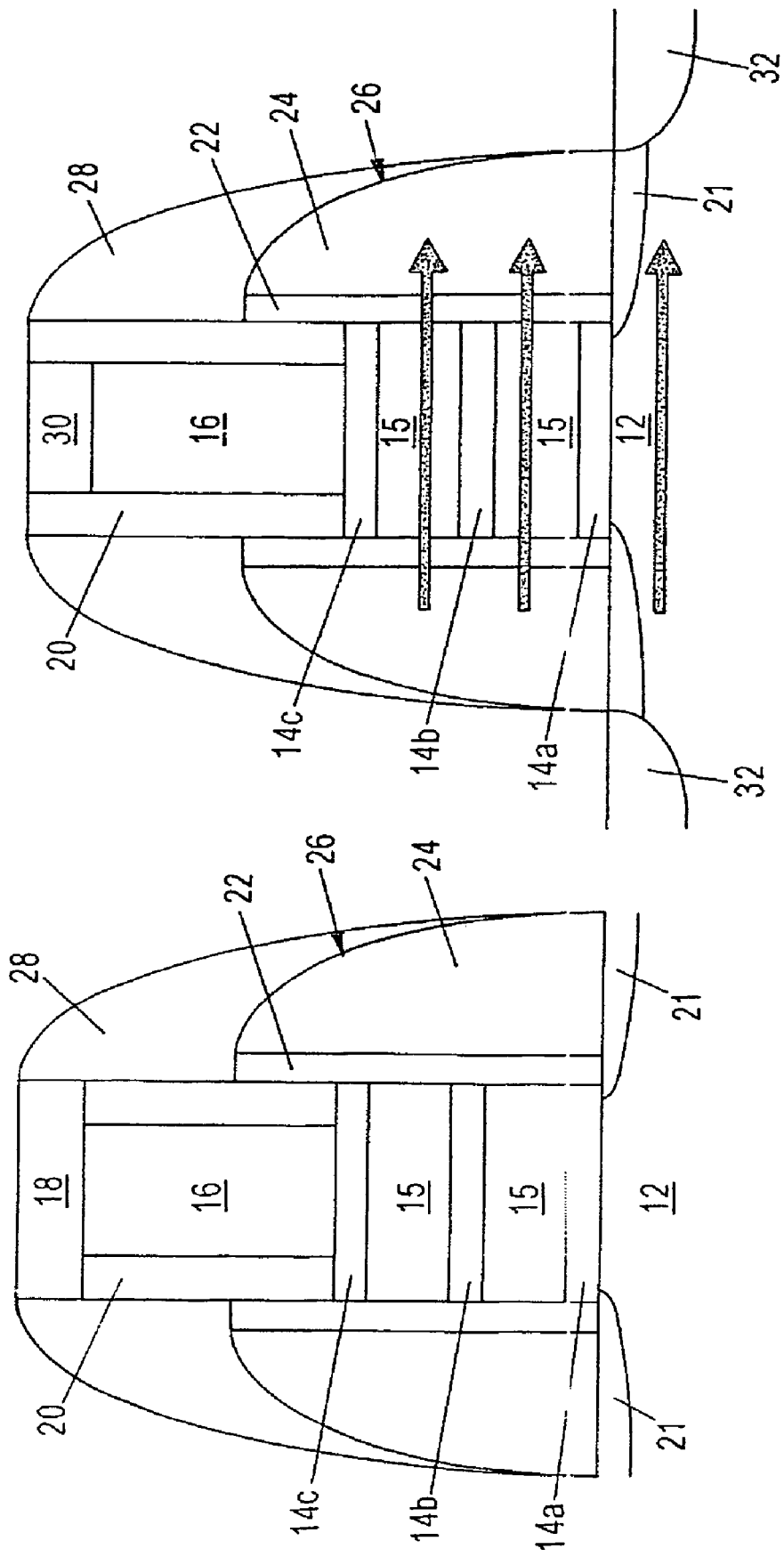

MULTI-OPERATIONAL MODE TRANSISTOR WITH MULTIPLE-CHANNEL DEVICE STRUCTURE

FIELD OF THE INVENTION

The present invention relates to the field of semiconductor technology, and more particularly, to integrated circuits with multiple operating modes.

BACKGROUND OF THE INVENTION

In an ultra-large scale integrated (ULSI) circuit, there may be transistors operating with various threshold voltages and gate oxide thicknesses. In order to achieve such a circuit with transistors operating at various threshold voltages and having different gate oxide thicknesses, manufacturing process conditions are adjusted. Various device parameters may be adjusted by the adjustment of the process conditions. These include halo implant and oxidation recipes.

One of the concerns with such a methodology to achieve a circuit with a plurality of transistors operating at various threshold voltages is the manufacturing complexity required to achieve such a circuit. The implants and oxidation recipes that are developed must be properly controlled with several lithography reticles.

SUMMARY OF THE INVENTION

There is a need for providing a transistor and method for manufacturing the same that reduces the complexity in manufacturing on a chip integrated transistors operating at various threshold voltages.

This and other needs are met by embodiments of the present invention which provide a method of forming a semiconductor device, comprising the steps of forming multiple channels and forming a gate electrode on the multiple channels. The threshold voltage for each channel is independently adjusted.

By providing a multiple-channel device and independent adjustment of the threshold voltage for each channel, a single transistor may be provided with multiple operating modes. This has the beneficial effect of reducing the fabrication complexity and number of lithography reticles. At the same time, the operating speed may be improved by providing transistors with higher drive currents.

The earlier stated needs are also met by other embodiments of the present invention which provide a method of forming a multiple operating mode transistor, comprising the steps of forming multiple channels, at least one of the channels having different operational parameters than at least one of the other channels. A gate electrode is formed on the multiple channels.

Providing a multiple operating mode transistor with multiple channels having different operational parameters than the other channels allows simplification of the manufacturing of the circuitry, while also increasing drive current.

The earlier stated needs are met by still further embodiments of the present invention which provide a multiple operating mode transistor comprising multiple channels having different respective operational characteristics, and a gate electrode on the multiple channels.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 depicts the structure of FIG. 2 following a lightly doped silicon deposition and a heavily doped silicon deposition, in accordance with embodiments of the present invention.

FIG. 4 shows the structure of FIG. 3 after a silicon spacer etch has been performed, in accordance with embodiments of the present invention.

FIG. 5 depicts the structure of FIG. 4 following the formation of an oxide or nitride spacer on the gate electrode and silicon spacers.

FIG. 6 shows the structure of FIG. 5 after a source and drain implantation and the formation of a silicide region in the gate electrode, in accordance with embodiments of the present invention.

DETAILED DESCRIPTION OF THE INVENTION

The present invention addresses and solves problems related to the provision of transistors with different operating modes in an integrated circuit, with reduced complexity and manufacturing processes. This is achieved, in part, by the formation of a semiconductor device with multiple channels and a gate electrode on the multiple channels. The threshold voltage for each channel is independently adjusted. In certain embodiments of the invention, the independent adjustment of the threshold voltages of the different channels includes at least one of providing different respective doping concentrations in the multiple channels, different respective gate dielectric thicknesses for the gate dielectrics, or providing different respective silicon channel thicknesses for the multiple channels.

FIGS. 1-6 describe a method of making a multiple operating mode transistor in accordance with embodiments of the present invention. The description will discuss certain materials and process steps in an exemplary manner, and it should be recognized that these materials and process steps are exemplary only as other materials and process steps may be employed without departing from the present scope of the present invention.

Figure 1:
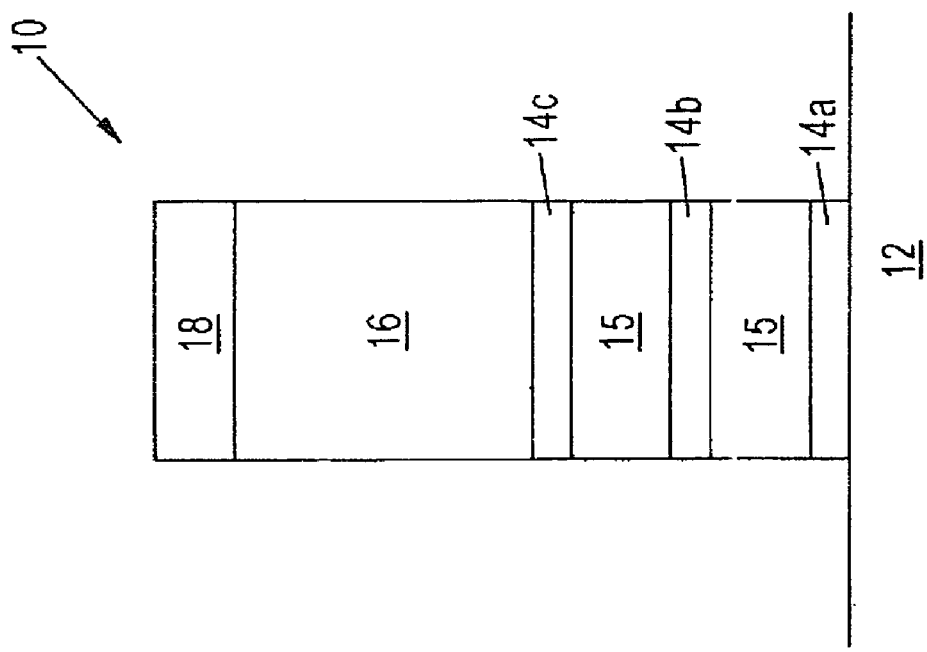
FIG. 1 depicts a stack formed in accordance with embodiments of the present invention after an etching of layers has been performed to create the stack.

FIG. 1 depicts a stack 10 that has been created on a substrate 12 by a dry etching of layers that have been previously formed. The stack 10 of FIG. 1 includes a first oxide layer 14a, a lightly doped polysilicon (hereafter "silicon") layer 15a, a second oxide layer 14b, a second lightly doped silicon layer 15b, and a third oxide layer 14c. The third oxide layer 14c forms a gate oxide layer in FIG. 1. The stack 10 includes a heavily doped polysilicon gate electrode 16 and hard mask 18, such as silicon nitride, for example, or other hard mask material.

Figure 9:
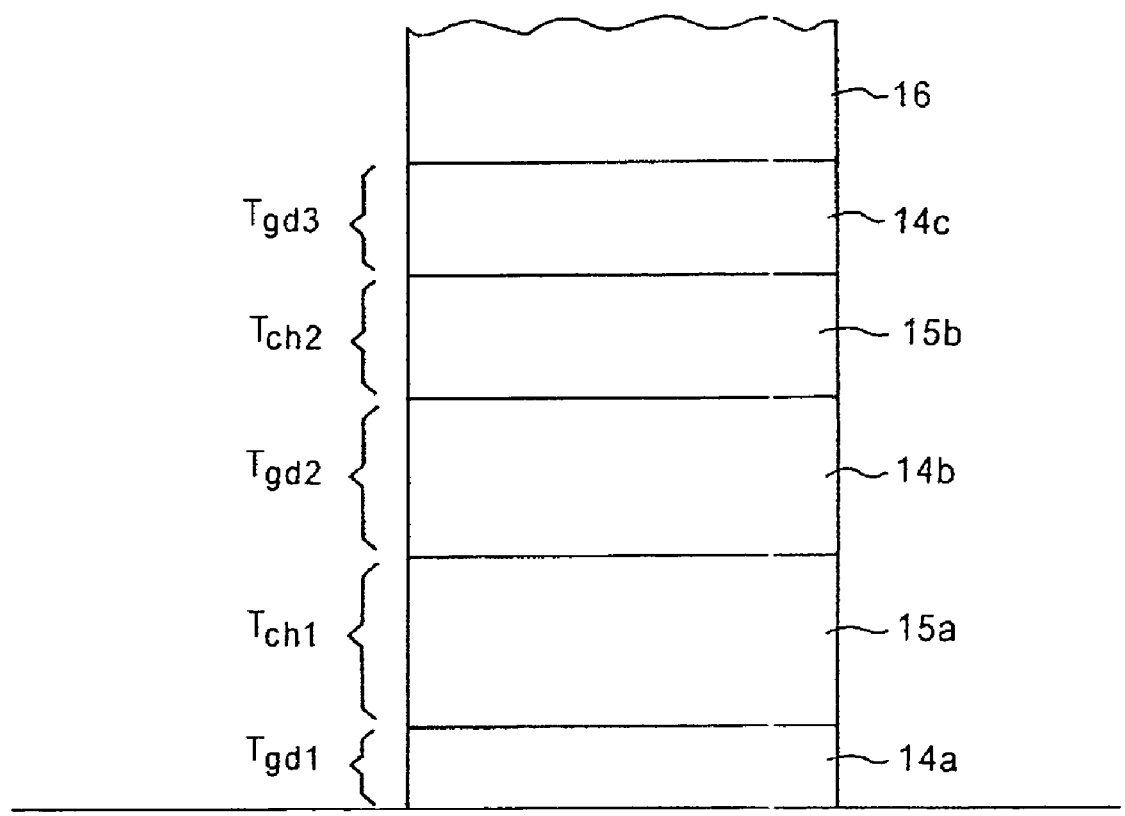
FIG. 9 shows in greater detail the gate stack of FIG. 1 in an exemplary embodiment.

In FIG. 1, the gate dielectric layers 14a, 14b and 14c are described as oxide layers, and depicted with having substantially the same thickness. Also, the first and second silicon layers 15a, 15b are also depicted as having substantially the same thickness. However, the present invention provides for independent adjustment of the threshold voltage through each channel of the transistor to thereby provide different operating modes for the transistor. The depiction of the gate stack in FIGS. 1-6 is therefore only for illustrative purposes. Referring now to FIG. 9, a more detailed depiction of an exemplary embodiment of the stack of FIG. 1 is provided. In preferred embodiments of the invention, the silicon in each layer 15a, 15b is doped prior to the formation of the next layer. The silicon layers 15a, 15b are doped with a first conductivity type, such as p conductivity type, and gate electrode 16 is doped with a second conductivity type, such as n conductivity type. Alternatively, the gate electrode 16 is doped with p type dopants while the silicon in channel regions 15a, 15b are doped with n type dopants. Furthermore, the silicon regions 15 and 16 may comprise other semiconductor materials, such as silicon germanium (SiGe).

As apparent from the exemplary depiction of FIG. 9, the layers in the stack 10 have different respective thicknesses. For example, the first gate oxide layer 14a (or "gate dielectric") has a thickness $T_{gd1}$, and the second oxide layer 14b has a greater thickness $T_{gd2}$. The third gate oxide layer 14c has a thickness $T_{gd3}$, which has a value between $T_{gd1}$ and $T_{gd2}$. Hence, the formation of the gate oxide layers 14a-14c can be varied by varying the thickness. In the multiple operating mode transistor of the present invention, the provision of different gate oxide thicknesses (or gate dielectric thicknesses if the gate dielectric is made from something other than oxide) provides for an independent adjustment of the threshold voltage for each channel. The different thicknesses depicted in FIG. 9 are exemplary only, as other thicknesses may be employed without departing from the scope of the present invention. The variation in the gate oxide thickness is but one parameter that may be changed in multiple channels in order to independently adjust the threshold voltage for each channel. For example, instead of varying the thicknesses of the gate oxide layers, the different gate oxide layers 14a-14c may be made of different gate dielectric materials having different dielectric constants.

Another parameter that allows for independent adjustment of the threshold voltage for each channel is the thickness of the silicon channels 15a, 15b. For example, silicon channel 15a may have a first thickness $T_{ch1}$, which is thicker than the thickness of $T_{ch2}$ of the second silicon channel 15b. Again, this is exemplary only, as the channel thicknesses are independently adjustable to a desired amount to achieve the independently adjusted threshold voltages.

A third parameter that may be used to independently adjust the threshold voltage for each channel is the dopant concentration provided in the separate channels 15a and 15b. In other words, the dopant concentration in channel 15a may be greater than the dopant concentration in channel 15b, or vice versa.

From the above description, it is apparent that the threshold voltage for each channel may be independently adjusted by providing at least one of: different respective dopant concentrations in the first and second channels 15a, 15b; different respective gate dielectric thicknesses for the first, second and third gate dielectrics 14a-14c; and different respective thicknesses for the first and second silicon channels 15a, 15b.

In the remaining Figures (FIGS. 2-8), depicting the processing of the present invention, the stack will be shown as that of FIG. 1 so as not to obscure the present invention. In other words, the layers are shown as being of equal thickness. Reference should be made, however, to the description of the stack of FIG. 9 depicting variations in thicknesses, as well as the discussion of varying dopant concentrations.

Figure 2:
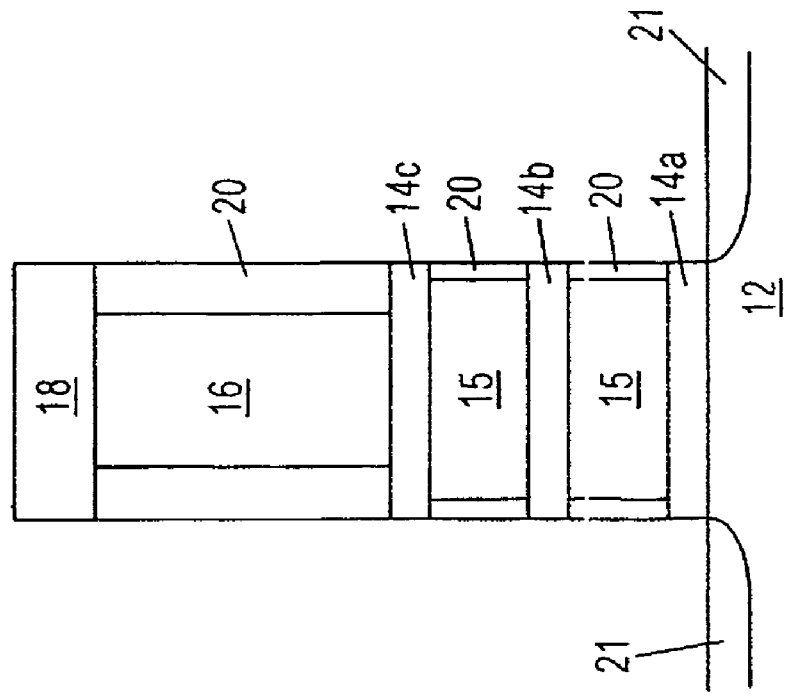
FIG. 2 depicts the structure of FIG. 1 following a thermal oxidation process in the source and drain extension implant, in accordance with embodiments of the present invention.

Following the formation of stack 10 as described above, a thermal oxidation process is performed, the results of which are depicted in FIG. 2. For example, the stack may be exposed to temperatures between about 900° to 1,000° for approximately less than ten minutes in an environment suitable for oxidation, as is well known. Strict control of the thermal oxidation process is necessary, especially in applications such as sub-45 nm ULSI devices, to prevent the gate electrode 16 from being over-oxidized. This may readily occur since heavily doped silicon, such as that in the gate electrode 16, allows oxide to grow much faster than in the lightly doped silicon, such as in the channel regions 15. FIG. 2 also shows the formation of source and drain extensions by source and drain extension implants 21. This may be performed in a conventional manner.

FIG. 3 shows the structure of FIG. 2 following the sequential deposition of a lightly doped silicon layer 22 and a heavily doped silicon layer 24. The layers 22 and 24 are doped with the same conductivity type dopant as in the gate electrode 16. Hence, the exemplary embodiment being described, the dopant is an n-type dopant. Deposition of the silicon layers 22 and 24 may be performed by chemical vapor deposition (CVD) for example. It is preferred to deposit doped silicon layers rather than attempting to dope by ion implantation the silicon layers after they have been deposited, since control of the implantation process to form a lightly doped region and heavier doped regions is difficult to control in this arrangement. However, it is also possible to perform implanting to achieve the desired doping, and certain embodiments of the invention perform such implanting.

A silicon etch is then performed to form silicon spacers 26 that include the lightly doped regions 22 and the heavily doped regions 24. The silicon spacers 26 contact the first and second channel regions 15a, 15b but are electrically isolated from the gate electrode 16 by the thermal oxide 20.

FIG. 5 shows the structure of FIG. 4 following the deposition of an insulating spacer material and a dry etch procedure that forms spacers 28 over the silicon spacers 26. The insulating material may be an oxide or nitride or other suitable material, for example.

FIG. 6 depicts the structure of FIG. 5 after the hard mask 18 has been removed by etching, for example. A portion of the gate electrode 16 is silicided to form a silicide region 30 by conventional silicide techniques, including the deposition of a refractory metal layer and annealing to silicidize a portion of the gate electrode 16.

A source and drain implant process is performed in a conventional manner to create source and drain regions 32 in the substrate 12. The spacers 26, 28 serve as a mask during the source and drain implant process.

The arrows in FIG. 6 represent an exemplary electron flow through the multiple channels created in the device of the present invention. Hence, while not increasing the width of the semiconductor device, the multiple channels (three such channels in the FIG. 6 embodiment) provide increased electron flow and drive current. Further, gate leakage current and gate capacitance are reduced. As described above, independent adjustment of the threshold voltage may be achieved by providing at least one of: different respective dopant concentrations in the silicon channels; different respective gate dielectric thicknesses for the first, second and third gate dielectrics; and different respective silicon channel thicknesses for the first and second silicon channels. However, other methods of independent adjustment may be employed without departing from the scope of the invention.

In certain embodiments of the invention, the gate electrode 16 may be formed of a metal or completely silicidized. The metal gate may be a replacement metal gate, or may be formed initially. Furthermore, one or more of the insulator layers 14a-14c may consist of a high k gate dielectric material, rather than a relatively lower k oxide or other material.

Figure 8:
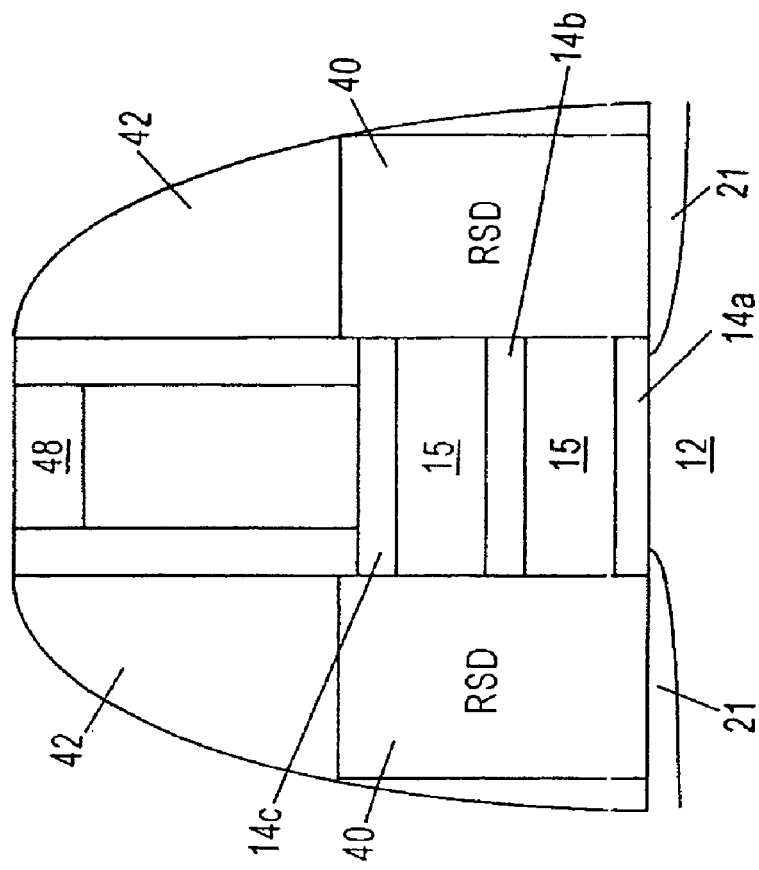
FIG. 8 depicts the structure of FIG. 7 after formation of an oxide or nitride spacer and silicide region in the gate electrode, in accordance with embodiments of the present invention.
Figure 7:
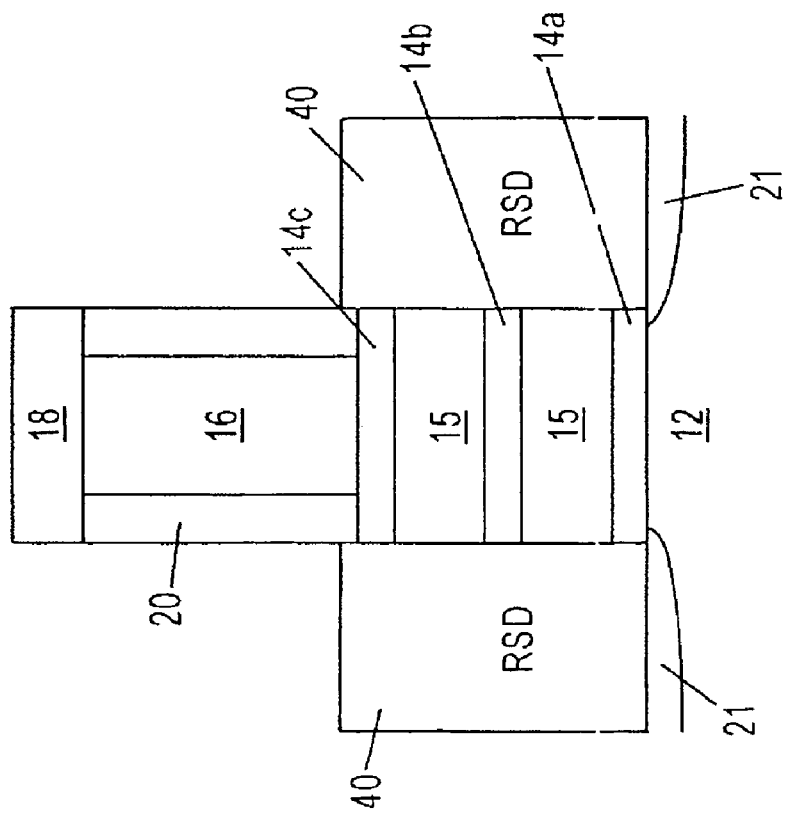
FIG. 7 shows an alternative embodiment of the present invention that follows FIG. 2 in the process flow, and in which raised source and drain structures are formed in accordance with embodiments of the present invention.

FIGS. 7 and 8 show structures constructed in accordance with another embodiment of the present invention. Following the thermal oxidation and source and drain extension implants steps of FIG. 2, FIG. 7 provides for a raised source and drain formation process. This is performed, for example, by growing silicon on the substrate 12 in a known manner, and then etching the silicon to form the raised source and drains 40.

In FIG. 8, an insulating spacer 42 has been formed over the raised source and drains 40. Spacers 42 are formed from an oxide or nitride, for example. A silicide region 48 is formed on the gate electrode 16, in a manner as described earlier.

Figure 10:
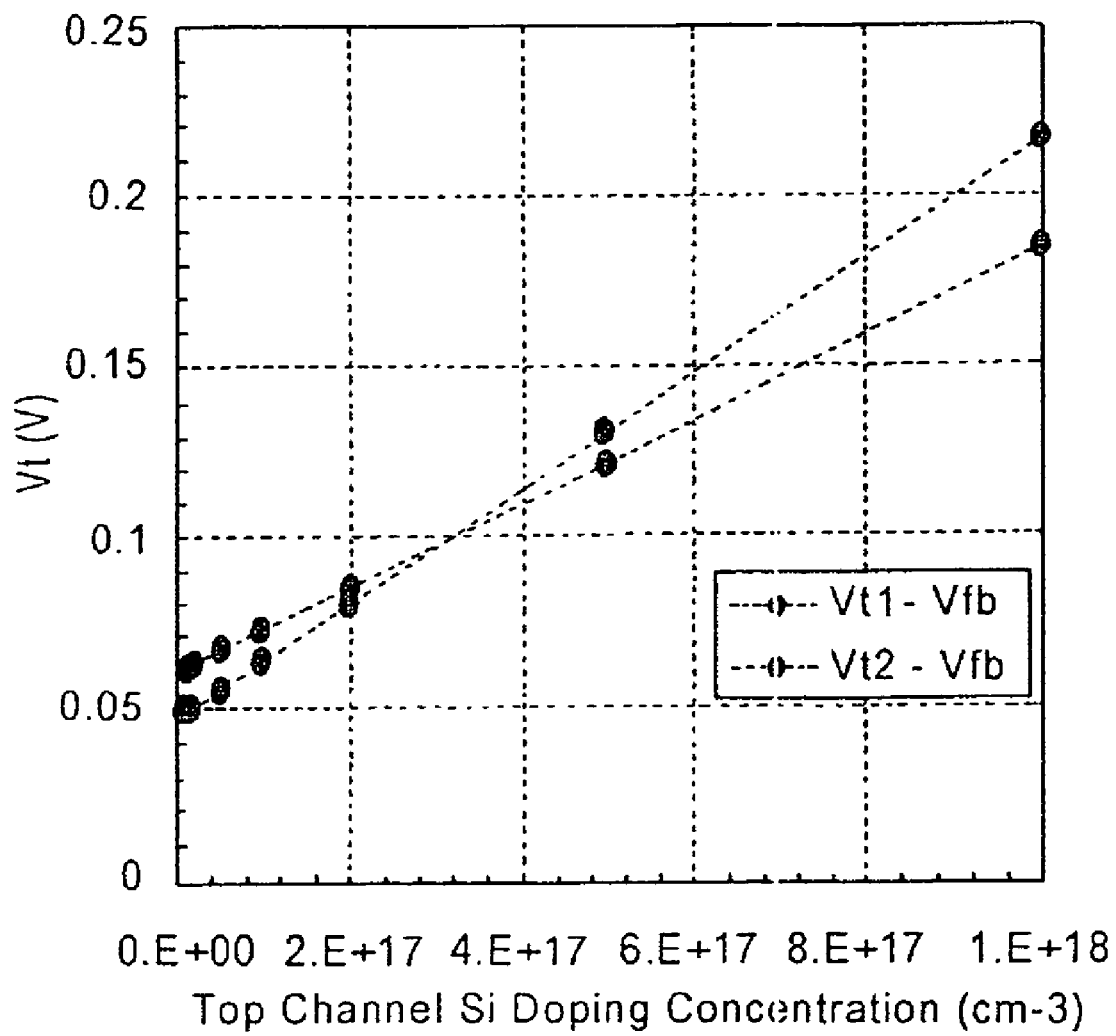
FIG. 10 depicts a simulation of a multiple operating mode transistor constructed in accordance with embodiments of the present invention.
Figure 11:
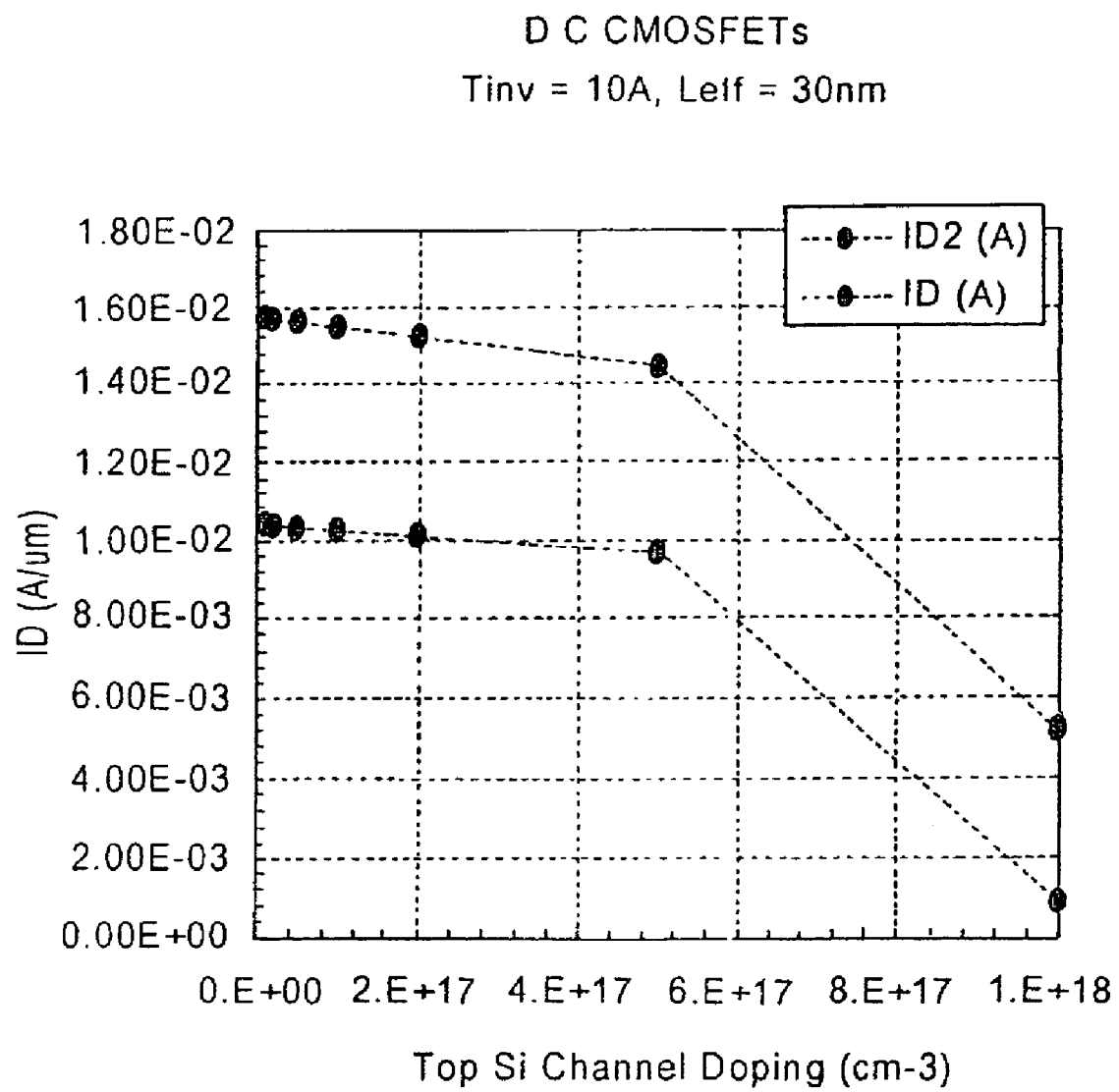
FIG. 11 depicts a simulation in which the drive current and gate leakage is shown to be chosen by turning on/off a certain number of the channels.

FIG. 10 shows a simulation of a multiple operating mode transistor constructed in accordance with embodiments of the present invention. For example, according to a simulation for a dual channel NMOSFET, if the top silicon channel doping is higher than about $3\times10^{17}$ cm$^2$, the top channel will be turned on, while the bottom channel will be turned off, and vice versa. In FIG. 11, an advantage of the multiple operating modes transistor is depicted in a simulation in which the drive current and gate leakage is shown to be chosen by turning on/off a certain number of the channels. The use of two channels shows an improvement in the drive current as compared to a single channel device.

The present invention thus provides a multiple operating modes transistor in which the different operating modes are readily achieved by independent adjustment of the threshold voltage for each channel of the transistor. This reduces the manufacturing complexity and number of lithography reticles required to achieve variations of device parameters and adjusting process conditions, such as halo implants and oxidation recipes, in a ULSI circuit with transistors operating at various threshold voltages and gate oxide thicknesses.

Although the invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a semiconductor device, comprising the steps of: forming multiple adjacent channels;
   doping each of the multiple adjacent channels with the same conductivity type;
   forming a gate electrode on the multiple adjacent channels; and
   independently adjusting the threshold voltage for each channel;
   wherein the step of forming multiple channels includes forming a first gate dielectric, a first silicon channel on the first gate dielectric, a second gate dielectric on the first silicon channel, a second silicon channel on the second date dielectric, and a third gate dielectric on the second channel.

2. The method of claim 1, wherein the step of independently adjusting the threshold voltage includes providing different respective dopant concentrations in the first and second channels.

3. The method of claim 1, wherein the step of independently adjusting the threshold voltage includes providing different respective gate dielectric thicknesses for the first, second and third gate dielectrics.

4. The method of claim 1, wherein the step of independently adjusting the threshold voltage includes providing different respective silicon channel thicknesses for the first and second channels.

5. The method of claim 1, wherein the step of independently adjusting the threshold voltage includes providing at least one of: different respective dopant concentrations in the first and second channels; different respective gate dielectric thicknesses for the first, second and their gate dielectrics; and different respective silicon channel thicknesses for the first and second silicon channels.

6. The method of claim 5, wherein the step of independently adjusting the threshold voltage for each channel includes adjusting the threshold voltages sufficiently differently such that application of a specified gate voltage will turn on one of the first and second channels while the other of the first and second channels remains off.

7. The method of claim 6, further comprising controlling a drive current to a specified value by controlling the number of the first and second channels turned on and off.

8. A method of forming a multiple operating mode transistor, comprising the steps of:
   forming multiple adjacent channels, each channel being doped with the same conductivity type, at least one of the channels having different operational parameters than at least one of the other channels; and
   forming a gate electrode on the multiple channels,
   wherein the step of forming multiple channels includes forming multiple silicon channels separated from each other and the gate electrode by gate dielectric layers.

9. The method of claim 8, wherein at least some of the multiple silicon channels are formed with different respective thicknesses.

10. The method of claim 9, wherein at least some of the gate dielectric layers are formed with different respective thicknesses.

11. The method of claim 10, wherein at least some of the silicon channels are doped with different respective dopant concentrations.

12. The method of claim 8, wherein the multiple channels are formed with independent control for each channel of at least one of: gate dielectric thickness; dopant concentration in the silicon channels; and thickness of the silicon channels.

13. A method of forming a semiconductor device, comprising the steps of:
   forming multiple adjacent channels, with each adjacent channel being doped the same conductivity type;
   forming a gate electrode on the multiple channels; and
   independently adjusting a threshold voltage for each channel.

14. The method of claim 13, wherein the step of forming multiple channels includes forming a first gate dielectric, a first silicon channel on the first gate dielectric, a second gate dielectric on the first silicon channel, a second silicon channel on the second date dielectric, and a third gate dielectric on the second channel.

15. The method of claim 13, wherein the step of independently adjusting the threshold voltage includes providing different respective dopant concentrations in the first and second channels.

16. The method of claim 13, wherein the step of independently adjusting the threshold voltage includes providing different respective gate dielectric thicknesses for the first, second and third gate dielectrics.

17. The method of claim 13, wherein the step of independently adjusting the threshold voltage includes providing different respective silicon channel thicknesses for the first and second channels.

18. The method of claim 13, wherein the step of independently adjusting the threshold voltage includes providing at least one of: different respective dopant concentrations in the first and second channels; different respective gate dielectric thicknesses for the first, second and their gate dielectrics; and different respective silicon channel thicknesses for the first and second silicon channels.

19. The method of claim 13, wherein the step of independently adjusting the threshold voltage for each channel includes adjusting the threshold voltages sufficiently differently such that application of a specified gate voltage will turn on one of the first and second channels while the other of the first and second channels remains off.

20. The method of claim 19, further comprising controlling a drive current to a specified value by controlling the number of the first and second channels turned on and off.

21. A method of forming a multiple operating mode transistor, comprising the steps of:

forming multiple adjacent channels, each adjacent channel being doped with the same conductivity type, at least one of the channels having different operational parameters than at least one of the other channels; and forming a gate electrode on the channels.

22. The method of claim 21, wherein the step of forming multiple channels includes forming multiple silicon channels separated from each other and the gate electrode by gate dielectric layers.

23. The method of claim 22, wherein at least some of the multiple silicon channels are formed with different respective thicknesses.

24. The method of claim 23, wherein at least some of the gate dielectric layers are formed with different respective thicknesses.

25. The method of claim 22, wherein at least some of the silicon channels are doped with different respective dopant concentrations.

26. The method of claim 21, wherein the multiple channels are formed with independent control for each channel of at least one of: gate dielectric thickness; dopant concentration in the silicon channels; and thickness of the silicon channels.

* * * * *